(12) United States Patent
Song

(10) Patent No.: US 6,445,017 B2
(45) Date of Patent: Sep. 3, 2002

(54) FULL CMOS SRAM CELL

(75) Inventor: Jun-eui Song, Suwon (KR)

(73) Assignee: Samsung Electronics Co., Ltd. (KR)

( * ) Notice: Subject to any disclaimer, the term of this patent is extended or adjusted under 35 U.S.C. 154(b) by 109 days.

(21) Appl. No.: 09/727,459

(22) Filed: Dec. 1, 2000

(30) Foreign Application Priority Data

Dec. 3, 1999 (KR) ............................................. 99-54789

(51) Int. Cl.$^7$ .............................................. H01L 27/10
(52) U.S. Cl. ...................... 257/204; 257/202; 257/206; 257/211; 257/909
(58) Field of Search ................. 257/204, 202, 257/206, 211, 909

(56) References Cited

U.S. PATENT DOCUMENTS

| | | | | |
|---|---|---|---|---|
| 5,373,170 A | * | 12/1994 | Pfiester et al. | 257/68 |
| 5,373,466 A | * | 12/1994 | Landeta et al. | 257/903 |
| 5,633,832 A | * | 5/1997 | Patel et al. | 365/189.11 |
| 5,654,915 A | | 8/1997 | Stolmeijer et al. | 365/156 |
| 5,834,851 A | * | 11/1998 | Ikeda et al. | 257/206 |
| 5,923,059 A | * | 7/1999 | Gheewala | 257/204 |
| RE36,440 E | * | 12/1999 | Lee et al. | 257/202 |
| 6,372,565 B2 | * | 4/2002 | Kim | 438/155 |

OTHER PUBLICATIONS

M. Ishida, et. al. "A Novel 6T–SRAM Cell Technology Designed with Rectangular Patterns Scalable Beyond 0.18 $\mu$m Generation and Desirable for Ultra High Speed Operation," 9/98, pp. 201–204.

* cited by examiner

*Primary Examiner*—Richard Elms
*Assistant Examiner*—Douglas Menz
(74) *Attorney, Agent, or Firm*—Mills & Onello LLP

(57) ABSTRACT

A full CMOS SRAM cell is provided. The SRAM cell includes first and second active regions formed on a semiconductor substrate, arranged parallel to each other. A third active region is formed on the semiconductor substrate between the first active region and the second active region parallel to the first active region, and a fourth active region is formed on the semiconductor substrate between the third active region and the second active region parallel to the second active region. A word line intersects the first and second active regions. A first common conductive electrode intersects the first active region and the third active region, and a second common conductive electrode intersects the second active region and the fourth active region.

10 Claims, 14 Drawing Sheets

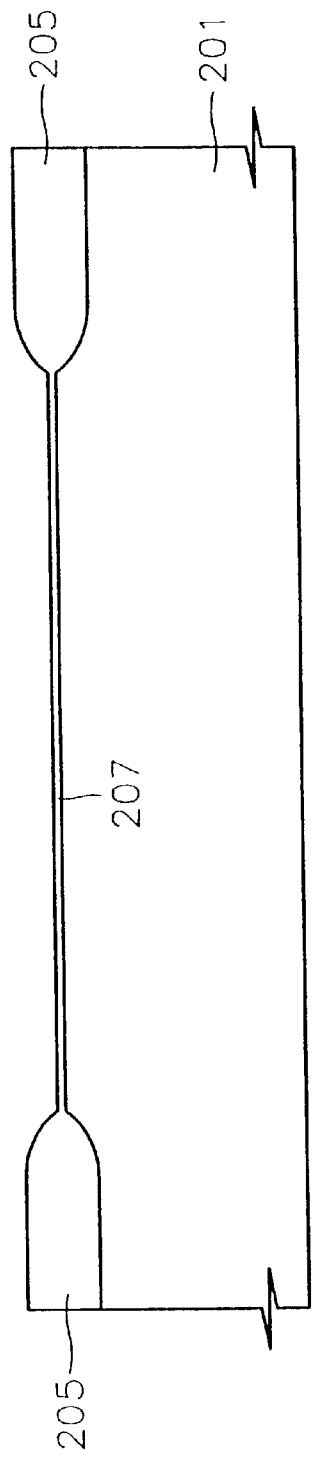
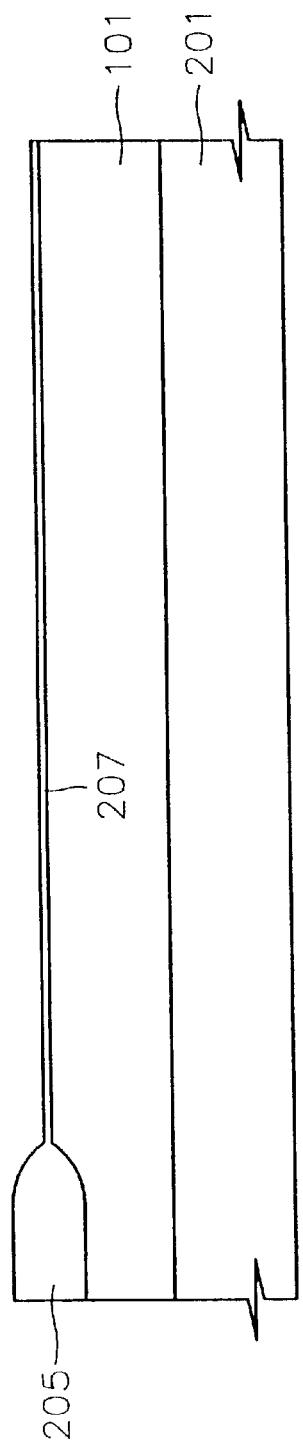

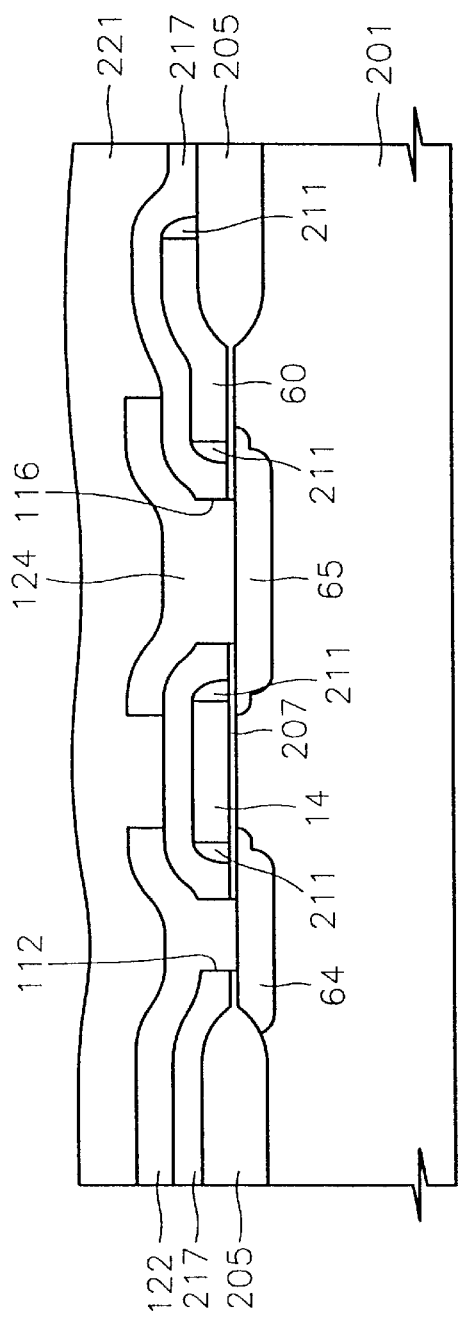
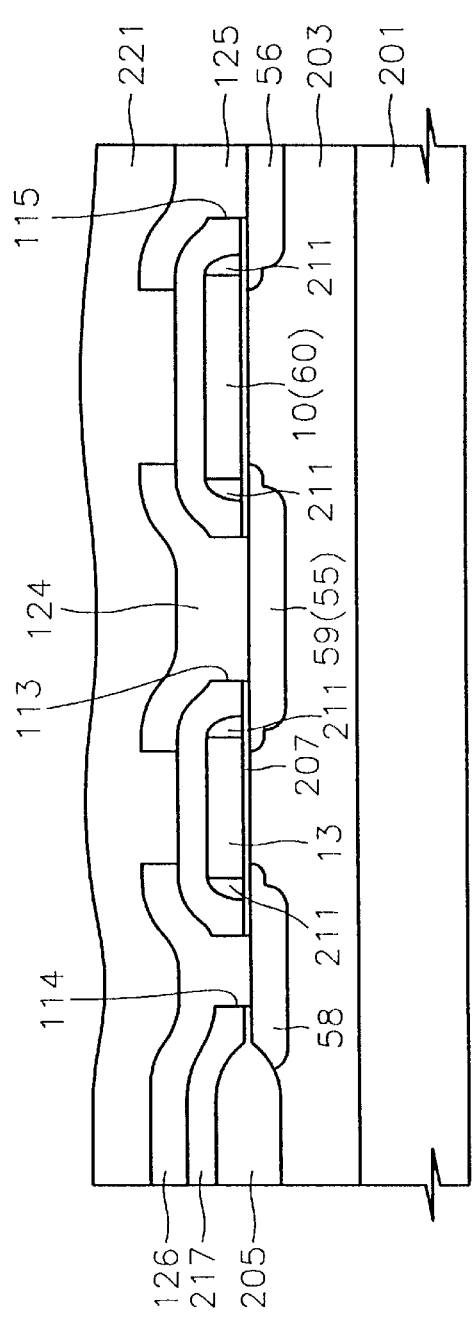
FIG. 11A
FIG. 11B

FULL CMOS SRAM CELL

BACKGROUND OF THE INVENTION

1. Field of the Invention

The present invention relates to a semiconductor device, and more particularly, to a full complementary metal oxide semiconductor (CMOS) static random access memory (SRAM) cell.

2. Description of the Related Art

An SRAM semiconductor memory device has a lower power consumption and a higher operation speed than a dynamic random access memory (DRAM). Thus, the SRAM device is widely used for cache memory of computer and portable electronic devices.

A memory cell of the SRAM device is divided into two types of cells, that is, one is a high load resistor cell employing a high load resistor as a load device, and the other is a CMOS type cell employing a PMOS transistor as a load device.

The CMOS type cell is also divided into two types of cells, that is, one is a thin-film transistor (TFT) cell employing a thin-film transistor (TFT) as the load device, and the other is a full CMOS cell employing a bulk transistor as the load device.

FIG. 1 is an equivalent circuit diagram of a general CMOS SRAM cell. Referring to FIG. 1, the CMOS SRAM cell is formed of a pair of driver transistors TD1 and TD2, a pair of transfer transistors TA1 and TA2, and a pair of load transistors TL1 and TL2. Here, the pair of driver transistors TD1 and TD2, and the pair of transfer transistors TA1 and TA2 are NMOS transistors. The pair of load transistors TL1 and TL2 are PMOS transistors.

A first driver transistor TD1 and a first transfer transistor TA1 are connected in series with each other. A source area of the first driver transistor TD1 is connected to a ground line Vss, and a drain area of the first transfer transistor TA1 is connected to a first bit line BL. Similarly, a second driver transistor TD2 and a second transfer transistor TA2 are also connected in series with each other. Also, a source area of the second driver transistor TD2 is connected to the ground line Vss, and a drain area of the second transfer transistor TA2 is connected to a second bit line /BL. The first and second bit lines BL and /BL maintain opposite information.

A source area and a drain area of a first load transistor TL1 are connected to a power line Vcc and a drain area of the first driver transistor TD1, namely, a first node N1, respectively. Similarly, a source area and a drain area of a second load transistor TL2 are connected to the power line Vcc and a drain area of the second driver transistor TD2, namely, a second node N2, respectively. A gate electrode of the first driver transistor TD1 and a gate electrode of the first load transistor TL1 are connected to the second node N2, and a gate electrode of the second driver transistor TD2 and a gate electrode of the second load transistor TL2 are connected to the first node N1. Also, gate electrodes of the first and second transfer transistors TA1 and TA2 are connected to a word line WL.

The above-described CMOS cell shows a lower stand-by current and a higher noise margin than a load resistor cell. Thus, the CMOS cell is widely used for a high-performance SRAM device requiring a low power supply voltage.

The equivalent circuit of the CMOS SRAM cell shown in FIG. 1 can be implemented on a semiconductor substrate in many configurations. FIG. 2 is a layout diagram of a conventional SRAM cell for implementing the equivalent circuit of the CMOS SRAM cell shown in FIG. 1 on the semiconductor substrate, and is one of many layout diagrams of an SRAM cell disclosed in a paper published by M. Ishida et al. (M. Ishida et al., IEDM 98, pp. 201–204). Also, M. Ishida et al. discloses the same cell layout diagram as that of the invention disclosed in the U.S. Pat. No. 5,654,915.

Referring to FIG. 2, a n-well region 21 is formed in a predetermined area of the semiconductor substrate, and an U-shaped first active region 23a is arranged in a p-well region around the n-well region 21. A second active region 23b parallel to an x-axis is arranged in the n-well region 21. A word line 25w is arranged on the semiconductor substrate so as to intersect the first active region 23a. The word line 25w is arranged parallel to the X-axis and intersects two parts of the first active region 23a. A first common gate electrode 25a intersecting the first active region 23a and the second active region 23b is arranged parallel to a y-axis. Also, a second common gate electrode 25b intersecting the first and second active regions 23a and 23b is arranged parallel to the y-axis. As a result, a pair of transfer transistors TA1 and TA2 and a pair of driver transistors TD1 and TD2, in which the word line 25w, the first common gate electrode 25a and the second common gate electrode 25b function as the gate electrode, are formed in the first active region 23a. Similarly, a pair of load transistors TL1 and TL2, in which the first common gate electrode 25a and the second common gate electrode 25b function as the gate electrode, are formed in the second active region 23b. As a result, the first driver transistor TD1 and the first load transistor TL1 form a first inverter, and the second driver transistor TD2 and the second load transistor TL2 form a second inverter.

A first node contact 27a is arranged on a drain area of the second driver transistor TD2 (an active region shared by the second driver transistor TD2 and the second transfer transistor TA2), a drain area of the second load transistor TL2, and the first common gate electrode 25a to expos them. And, a second node contact 27b is arranged on a drain area of the first driver transistor TD1 (an active region shared by the first driver transistor TD1 and the first transfer transistor TA1), a drain area of the first load transistor TL1, and the second common gate electrode 25b to expose them. Also, a ground contact 28s is arranged on the first active region 23a (a common source area of the first and second driver transistors TD1 and TD2) between the first common gate electrode 25a and the second common gate electrode 25b to expose itself. And, a power contact 28c is arranged on the second active region 23b (a common source area of the first and second load transistors TL1 and TL2) between the first common gate electrode 25a and the second common gate electrode 25b to expose itself. Further, first and second bit line contacts 29a and 29b are arranged on the first active region 23a adjacent to the word line 25w to expose itself.

The conventional full CMOS SRAM cell shown in FIG. 2 may be very sensitive to misarrangement during a photo process. Also, it is easy for leakage current to be caused in a node contact of the SRAM cell of FIG. 2.

FIG. 3 is a plan view of patterns in which the layout view of FIG. 2 is projected on the semiconductor substrate. Referring to FIG. 3, corner portions of actual active regions 23a' and 23b' formed after a photo process are transformed into a round shape. In particular, the first active region 23a of FIG. 2 has two curved regions C and C', which are curved by 90°. Thus, it is easy for crystalline defects to be caused in the semiconductor substrate around the curved regions C and C'. This is the reason why stress or damage from etching is concentrically applied to the curved regions while active regions are formed. In other words, this is the reason why stress from a pad nitride layer or damage from etching a trench is concentrated on the curved regions C and C', and as a result, it is easy for crystalline defects to be caused in the semiconductor substrate when a device isolation layer defining the active regions is formed by a local oxidation of silicon (LOCOS) process or a trench process. As a result, if the first and second node contacts (27a and 27b of FIG. 2) are formed in the curved regions C and C' in the following process, a leakage current flowing through each of the node contacts increases.

On the other hand, actual first and second common gate electrodes 25a' and 25b' and an actual word line 25w' are formed on the semiconductor substrate, in which the actual active regions 23a' and 23b' are formed, by using a photomask, in which the first and second common gate electrodes 25a and 25b and the word line 25w of FIG. 2 are drawn. Here, as shown by a dotted line, when the first and second common gate electrodes 25a'' and 25b'' are misaligned along the x-axis, the first driver transistor TD1 and the second driver transistor TD2 have different channel widths. Also, the first load transistor TL1 and the second load transistor TL2 have different channel widths. As a result, since the SRAM cell shows asymmetrical characteristics, cell stability deteriorates.

As described above, according to the prior art, since a node contact is formed in the curved region of an active region, leakage current characteristics of the node contact deteriorate. Also, in a case where misarrangement occurs during a photo process for forming gate patterns, cell stability deteriorates. Furthermore, it is difficult to reduce the length of a bit line perpendicular to a word line in one cell. With regard to the operation speed of the SRAM cell, for example, access time is increased more by a delay time caused by resistance and parasitic capacitance of the bit line than by a delay time caused by resistance and parasitic capacitance of the word line. Accordingly, minimizing the length of the bit line in one cell is very efficient in reducing the access time of the SRAM.

SUMMARY OF THE INVENTION

To solve the above problems, it is an object of the present invention to provide a full CMOS SRAM cell having a straight-line active region, for which it is possible to minimize the length of a bit line.

It is another object of the present invention to provide a full CMOS SRAM cell capable of increasing cell stability and improving leakage current characteristics of a node contact.

In accordance with the invention, there is provided a full CMOS SRAM cell. The full CMOS SRAM cell includes first and second active regions formed on a semiconductor substrate, arranged parallel to each other. A third active region is formed parallel to the first active region on the semiconductor substrate between the first active region and the second active region, and a fourth active region is formed parallel to the second active region on the semiconductor substrate between the third active region and the second active region. A word line intersects the first and second active regions. A first common conductive electrode intersects the first active region and the third active region, parallel to the word line, and a second common conductive electrode intersects the second active region and the fourth active region, parallel to the word line. In one embodiment, the first through fourth active regions are formed to be straight lines. A first transfer transistor having the word line as a gate electrode is formed in the first active region. A first driver transistor having the first common conductive electrode as a gate electrode is formed in the first active region. A first load transistor having the first common conductive electrode as a gate electrode is formed in the third active region. A second transfer transistor having the word line as a gate electrode is formed in the second active region. A second driver transistor having the second common conductive electrode as a gate electrode is formed in the second active region. A second load transistor having the second common conductive electrode as a gate electrode is formed in the fourth active region.

In one embodiment, the first and second active regions are formed on a first conductive type semiconductor substrate, for example, on a p-type semiconductor substrate, and the third and fourth active regions are formed on a second conductive type semiconductor substrate, for example, on a n-type semiconductor substrate. Also, the p-type semiconductor substrate may be a p-well region, and the n-type semiconductor substrate may be a n-well region. As a result, a first transfer transistor using the word line for a gate electrode and a first driver transistor using the first common conductive electrode for a gate electrode are formed in series in the first active region. Similarly, a second transfer transistor using the word line for a gate electrode and a second driver transistor using the second common conductive electrode for a gate electrode are formed in series in the second active region. In one embodiment, the first and second driver transistors and the first and second transfer transistors are NMOS transistors. Also, a first load transistor using the first common conductive electrode line for a gate electrode is formed in the third active region, and a second load transistor using the second common conductive electrode for a gate electrode is formed in series in the fourth active region. In one embodiment, the first and second load transistors are PMOS transistors.

A drain area of the first driver transistor is formed in the first active region between the word line and the first common conductive electrode, and a drain area of the first load transistor is formed in the second active region between the word line and the first common conductive electrode. The drain area of the first driver transistor is electrically connected to the drain area of the first load transistor through a first node pad. Also, a drain area of the second driver transistor is formed in the second active region between the word line and the second common conductive electrode, and a drain area of the second load transistor is formed in the fourth active region between the word line and the second common conductive electrode. The drain area of the second driver transistor is electrically connected to the drain area of the second load transistor through a second node pad. Furthermore, the first node pad is electrically connected to the second common conductive electrode through a second local interconnection, and the second node pad is electrically connected to the first common conductive electrode through a first local interconnection. As a result, the first and second driver transistors and the first and second load transistors constitute one latch circuit.

The full CMOS SRAM cell further includes a first ground line electrically connected to a source area of the first driver transistor, and a second ground line electrically connected to a source area of the second driver transistor. The first and second ground lines are parallel to each other and intersect the word line. A first ground line pad may be further interposed between the first ground line and the source area of the first driver transistor. Similarly, a second ground line pad may be further interposed between the second ground line and the source area of the second driver transistor.

Also, the full CMOS SRAM cell further includes a power line electrically connected to the source areas of the first and second load transistors. The power line is arranged between the first and second ground lines and intersects the word line. A power line pad may be further interposed between the power line and the source area of the first and second load transistors.

The full CMOS SRAM cell further includes first and second bit lines parallel to each other. The first and second bit lines intersect the word line and are electrically connected to the drain area of the first transfer transistor and the drain area of the second transfer transistor, respectively. A first bit line pad may be further interposed between the first bit line and the drain area of the first transfer transistor. Similarly, a second bit line pad may be further interposed between the second bit line and the drain area of the second transfer transistor.

According to the present invention, the first through fourth active regions are arranged parallel to one other and are formed to be straight lines. Thus, physical stress or damage from etching, etc., applied to the edges of each of the active regions while a device isolation process for forming each of the active regions on the semiconductor substrate is performed, can be minimized. As a result, junction leakage current of the first and second active regions electrically connected to the first node pad and junction leakage current of the second and fourth active regions electrically connected to the second node pad can be substantially reduced. Also, even when the first and second common conductive electrodes are misaligned in the first through fourth active regions, a quantity of variation in a channel width of the first and second driver transistors is reduced considerably more than in the prior art. Thus, cell stability can be improved. Furthermore, the SRAM cell having a bit line which is shorter than the length of a word line can be implemented by the present invention. Accordingly, a delay time of a signal caused by resistance and parasitic capacitance of the bit line can be reduced.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 9A, 10A, 11A, 12A and 13A are schematic sectional views taken along lines A—A' of FIGS. 4 through 8 illustrating a method for manufacturing the full CMOS SRAM cell of the invention.

FIGS. 9B, 10B, 11B, 12B and 13B are schematic sectional views taken along lines B—B' of FIGS. 4 through 8 illustrating a method for manufacturing the full CMOS SRAM cell of the invention.

DETAILED DESCRIPTION OF PREFERRED EMBODIMENTS OF THE INVENTION

Figure 1:
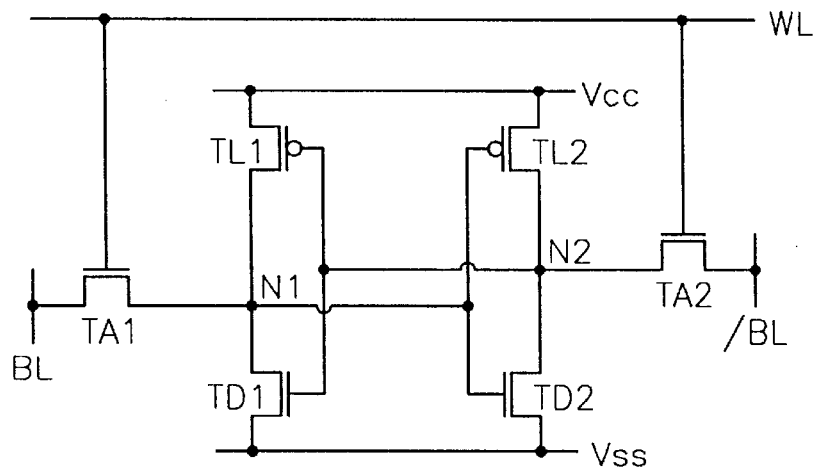
FIG. 1 is an equivalent circuit diagram of a general CMOS SRAM cell.
Figure 2:
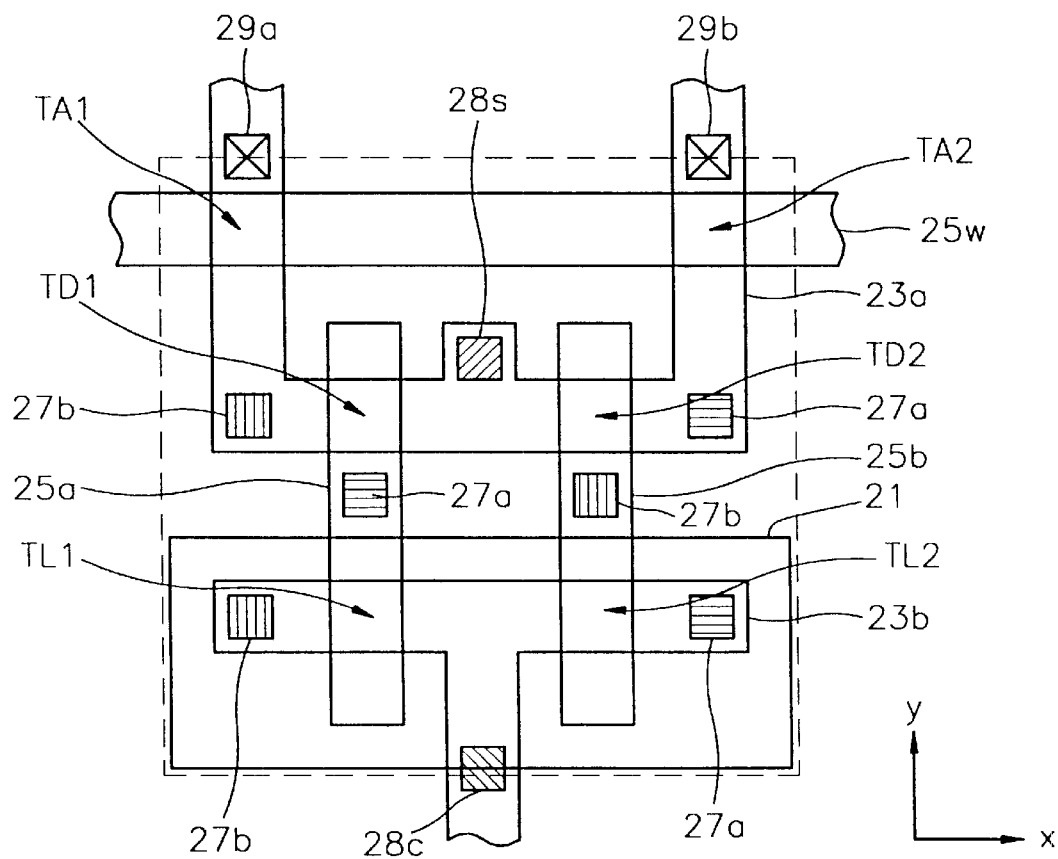
FIG. 2 is a layout diagram of a conventional full CMOS SRAM cell.
Figure 3:
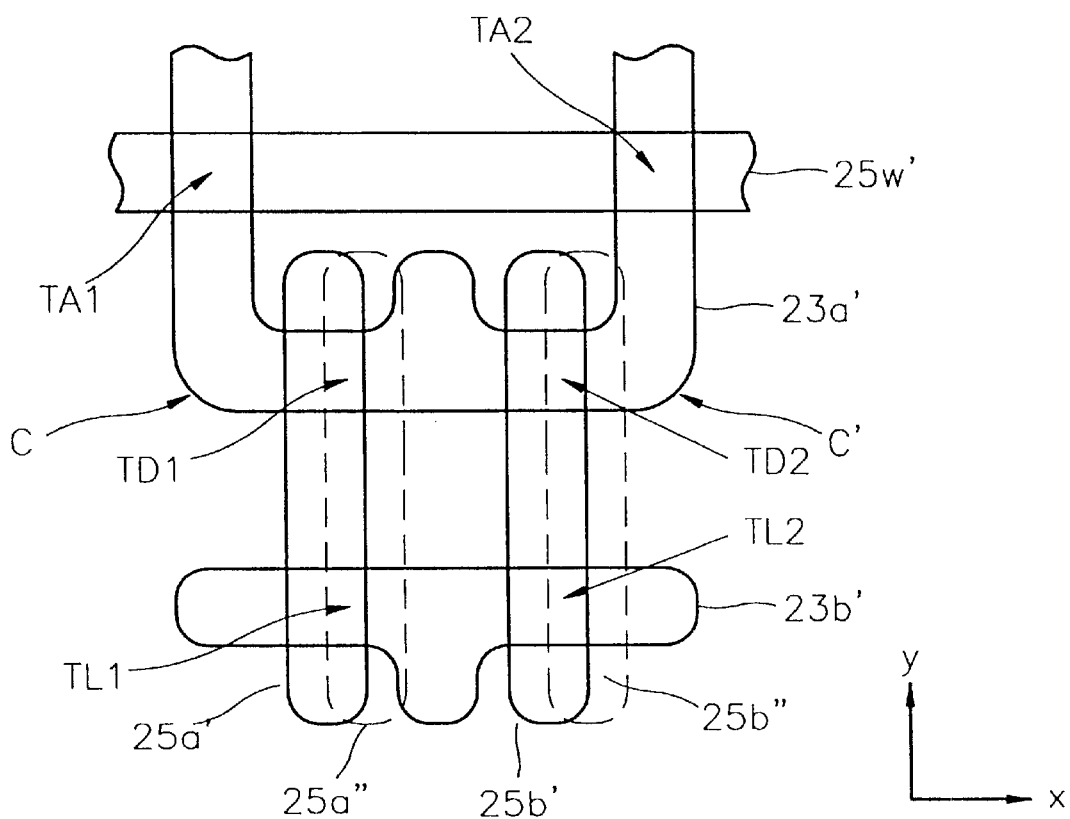
FIG. 3 is a plan view illustrating actual patterns of the full CMOS SRAM cell of FIG. 2.
Figure 4:
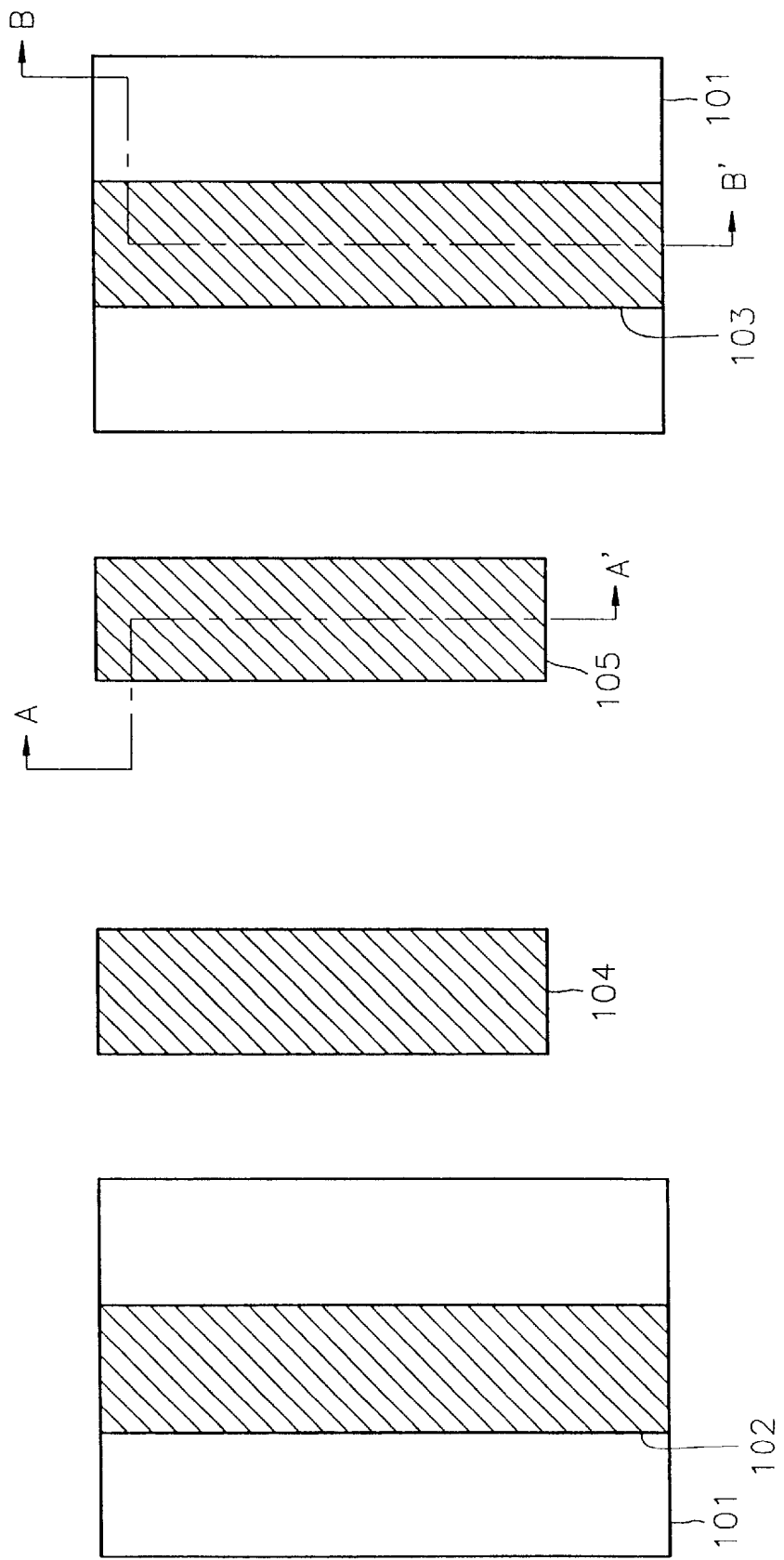
FIGS. 4 through 8 are plan views illustrating a structure of one embodiment of the full CMOS SRAM cell according to the present invention.

Referring to FIG. 4, first and second active regions 102 and 103 are formed parallel to each other on a semiconductor substrate, and third and fourth active regions 104 and 105 are formed parallel to each other between the first and second active regions 102 and 103. The third active region 104 is arranged to neighbor the first active region 102, and the fourth active region 105 is arranged between the third active region 104 and the second active region 103. As a result, the first through fourth active regions 102, 103, 104, and 105 are parallel to one another and are formed to be straight lines.

The first and second active regions 102 and 103 are formed in a first conductive type well region 101, preferably, in a p-well region, and the third and fourth active regions 104 and 105 are formed in a second conductive type well region, preferably, in a n-well region. The first conductive type well region 101 and the second conductive type well region may correspond to a first conductive type semiconductor substrate and a second conductive type semiconductor substrate.

Figure 5:
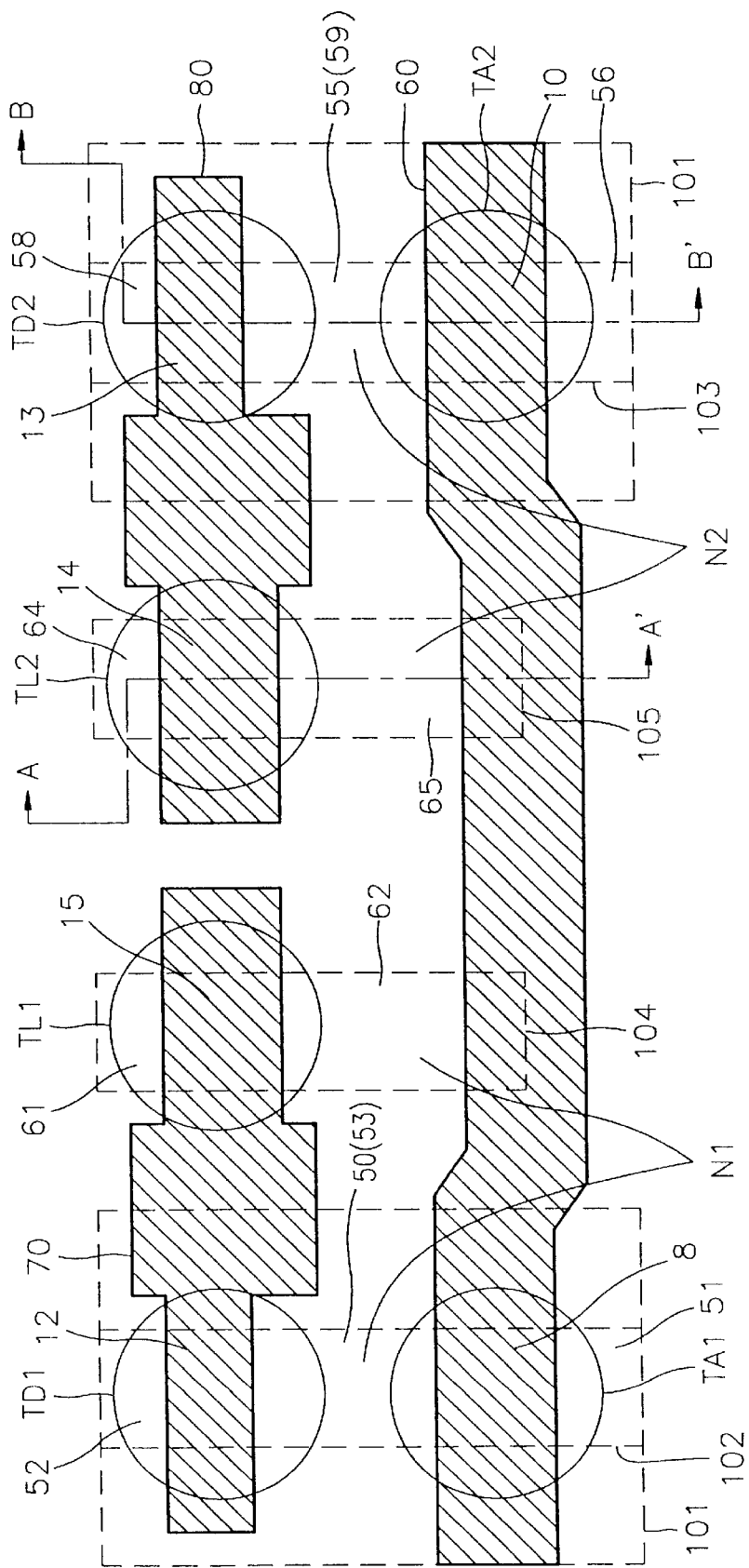

Referring to FIG. 5, a word line 60 intersects a first active region 102 and a second active region 103. Preferably, the third and fourth active regions 104 and 105 are formed to be shorter than the first and second active regions 102 and 103 so that the word line 60 may not completely intersect the third and fourth active regions 104 and 105. A first transfer transistor TA1 consisting of source/drain areas 50 and 51 and a gate electrode 8 is formed in the first active region 102, and a second transfer transistor TA2 consisting of source/drain areas 55 and 56 and a gate electrode 10 is formed in the second active region 103. Here, the gate electrodes 8 and 10 correspond to a part of the word line 60. Preferably, the first and second transfer transistors TA1 and TA2 are NMOS transistors.

Referring again to FIG. 5, a first common conductive electrode 70 intersects the first and third active regions 102 and 104. The first common conductive electrode 70 is arranged parallel to the word line 60. Similarly, a second common conductive electrode 80 intersects the second and fourth active regions 103 and 105. The second common conductive electrode 80 is also arranged parallel to the word line 60. Source/drain areas 52 and 53 formed in a gate electrode 12 consisting of a part of the first common conductive electrode 70 and the first active region 102 constitute a first driver transistor TD1, and source/drain areas 58 and 59 formed in a gate electrode 13 consisting of a part of the second common conductive electrode 80 and the second active region 103 constitute a second driver transistor TD2. Also, source/drain areas 61 and 62 formed in a gate electrode 15 consisting of a part of the first common conductive electrode 70 and the third active region 104 constitute a first load transistor TL1, and source/drain areas 64 and 65 formed in a gate electrode 14 consisting of a part of the second common conductive electrode 80 and the fourth active region 105 constitute a second load transistor TL2. Preferably, the first and second driver transistors TD1 and TD2 are NMOS transistors, and the first and second load transistors TL1 and TL2 are PMOS transistors.

As a result, the first driver transistor TD1 and the first transfer transistor TA1 are arranged in series in the straight line first active region 102, and the second driver transistor TD2 and the second transfer transistor TA2 are arranged in series in the straight line second active region 103. The drain area 53 of the first driver transistor TD1 and the drain area 62 of the first load transistor TL1 constitute a first node N1. In this way, the drain area 59 of the second driver transistor TD2 and the drain area 65 of the second load transistor TL2 constitute a second node N2. Here, even when the word line 60, the first common conductive electrode 70, and the second common conductive electrode 80 are misaligned in a direction perpendicular to the word line 60, channel widths of the first and second driver transistors TD1 and TD2, the first and second load transistors TL1 and TL2, and the first and second transfer transistors TA1 and TA2 are unchanged. This is the reason why the first and second active regions 102 and 103 and the third and fourth active regions 104 and 105 are formed to be straight lines.

Figure 6:
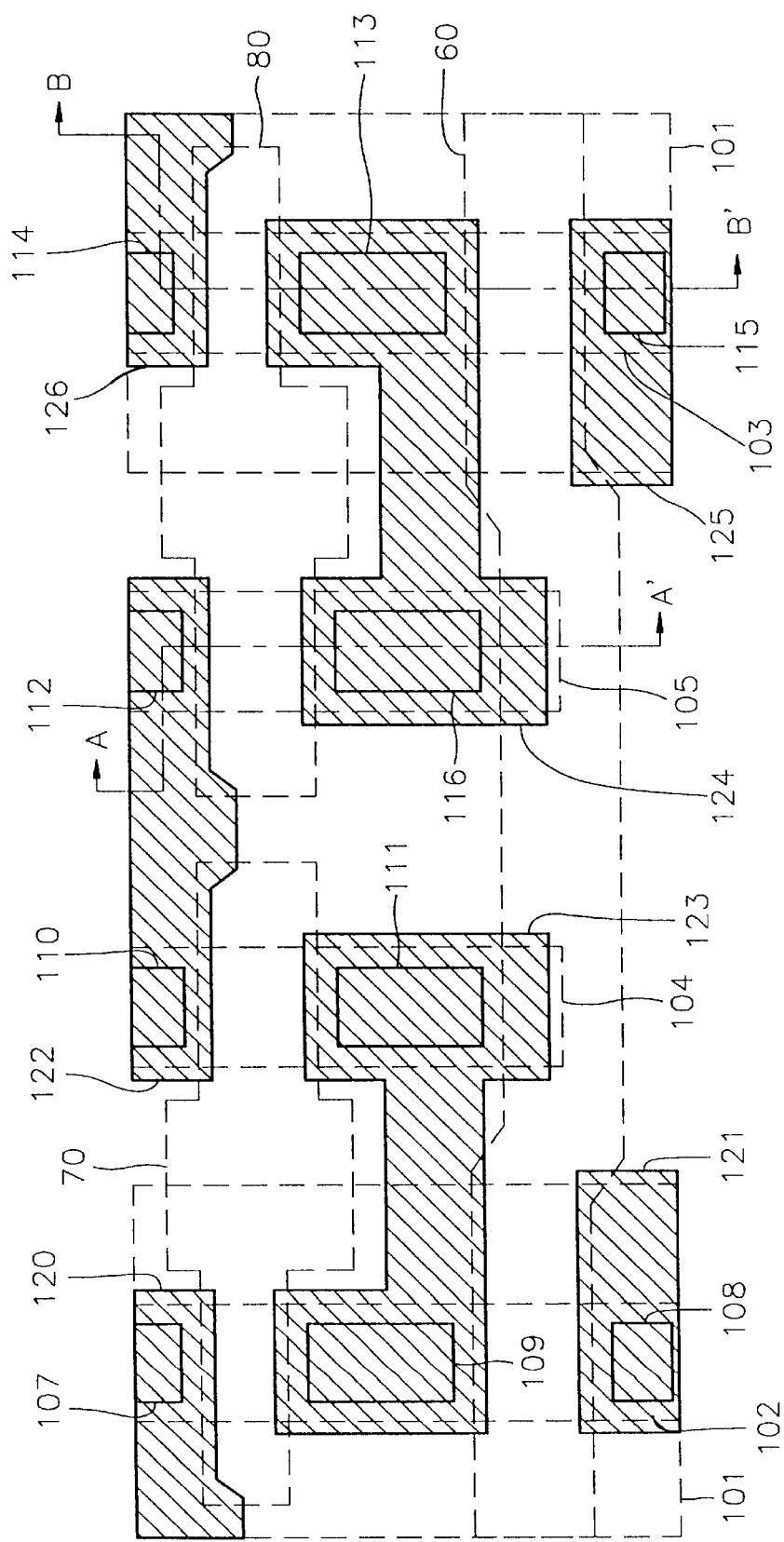

Referring to FIG. 6, a first ground line pad 120 is arranged in a source area of the first driver transistor TD1, and a second ground line pad 126 is arranged in a source area of the second driver transistor TD2. The first ground line pad 120 is electrically connected to the source area of the first driver transistor TD1 through a first ground line pad contact hole 107. Similarly, the second ground line pad 126 is electrically connected to the source area of the second driver transistor TD2 through a second ground line pad contact hole 114.

The drain area of the first driver transistor TD1 and the drain area of the first load transistor TL1 are electrically connected to each other through a first node pad 123. One end of the first node pad 123 is electrically connected to the drain area of the first driver transistor TD1 through a first node pad contact hole 109, and the other end of the first node pad 123 is electrically connected to the drain area of the first load transistor TL1 through a first node pad contact hole 111. Also, the drain area of the second driver transistor TD2 and the drain area of the second load transistor TL2 are electrically connected to each other through a second node pad 124. One end of the second node pad 124 is electrically connected to the drain area of the second driver transistor TD2 through a second node pad contact hole 113, and the other end of the second node pad 124 is electrically connected to the drain area of the second load transistor TL2 through a second node pad contact hole 116.

Also, one power line pad 122 contacts with source areas of the first and second load transistors TL1 and TL2. The source area of the first load transistor TL1 is electrically connected to one power line pad 122 through a first power line pad contact hole 110. Similarly, the source area of the second load transistor TL2 is electrically connected to one power line pad 122 through a second power line pad contact hole 112.

Furthermore, a first bit line pad 121 and a second bit line pad 125 are arranged at the drain area of the first transfer transistor TA1 and the drain area of the second transfer transistor TA2, respectively. The first bit line pad 121 is electrically connected to the drain area of the first transfer transistor TA1 through a first bit line pad contact hole 108 exposing the drain area of the first transfer transistor TA1. Similarly, the second bit line pad 125 is electrically connected to the drain area of the second transfer transistor TA2 through a second bit line pad contact hole 115 exposing the drain area of the second transfer transistor TA2.

Figure 7:
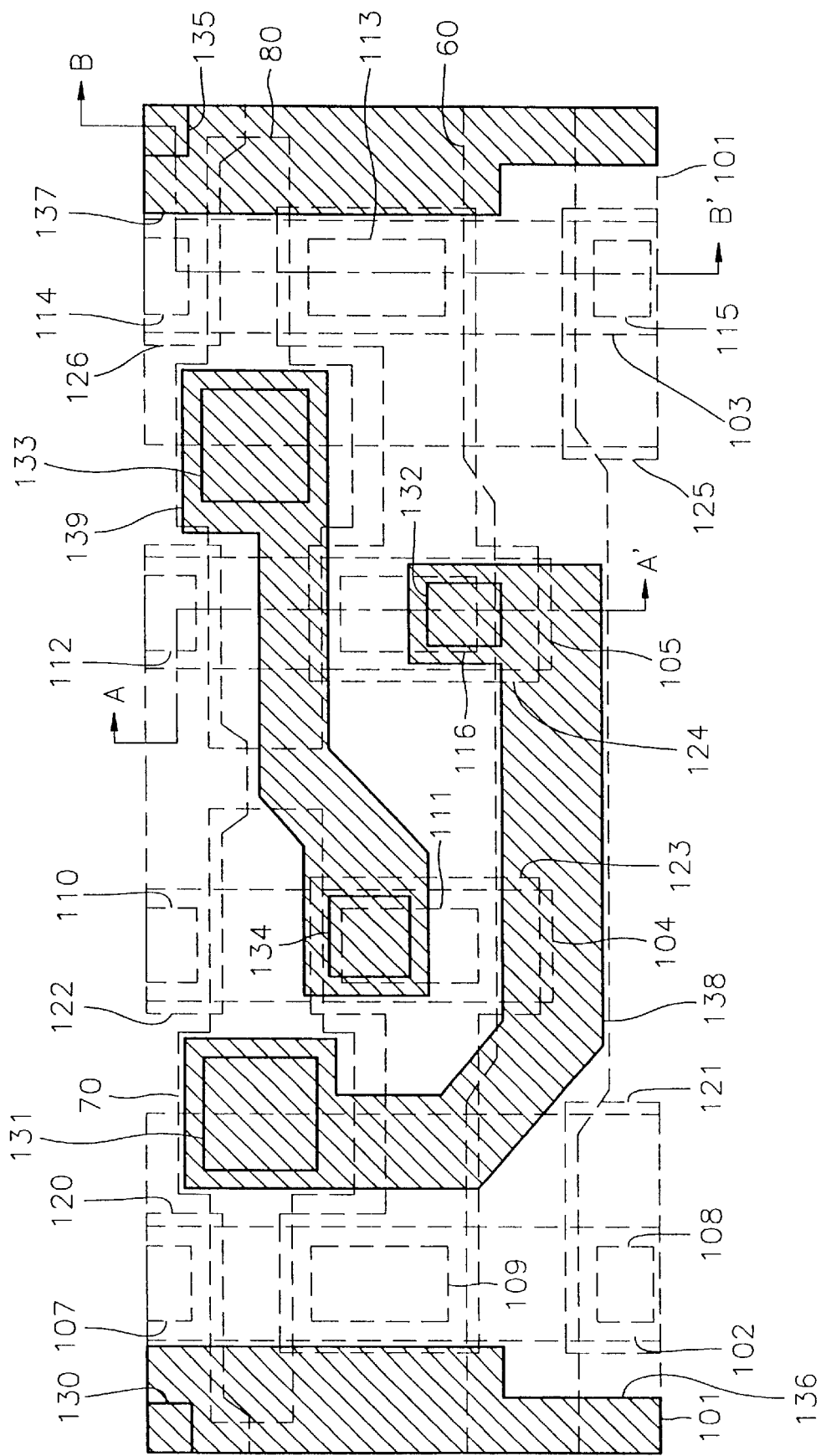

Referring to FIG. 7, the first common conductive electrode 70 is electrically connected to the second node pad 124 through a first local interconnection 138, and the second common conductive electrode 80 is electrically connected to the first node pad 123 through a second local interconnection 139. One end of the first local interconnection 138 contacts with the first common conductive electrode 70 through a first local interconnection contact hole 131, and the other end of the first local interconnection 138 contacts with the second node pad 124 through another first local interconnection contact hole 132. Similarly, one end of the second local interconnection 139 contacts with the second common conductive electrode 80 through a second local interconnection contact hole 133, and the other end of the first local interconnection 139 contacts with the first node pad 123 through another second local interconnection contact hole 134.

Also, the first ground line pad 120 is electrically connected to a first ground line 136 intersecting the word line 60, and the second ground line pad 126 is electrically connected to a second ground line 137 intersecting the word line 60. The first ground line 136 contacts with the first ground line pad 120 through a first ground line contact hole 130 exposing the first ground line pad 120. Similarly, the second ground line 137 contacts with the second ground line pad 126 through a second ground line contact hole 135 exposing the second ground line pad 126.

Figure 8:
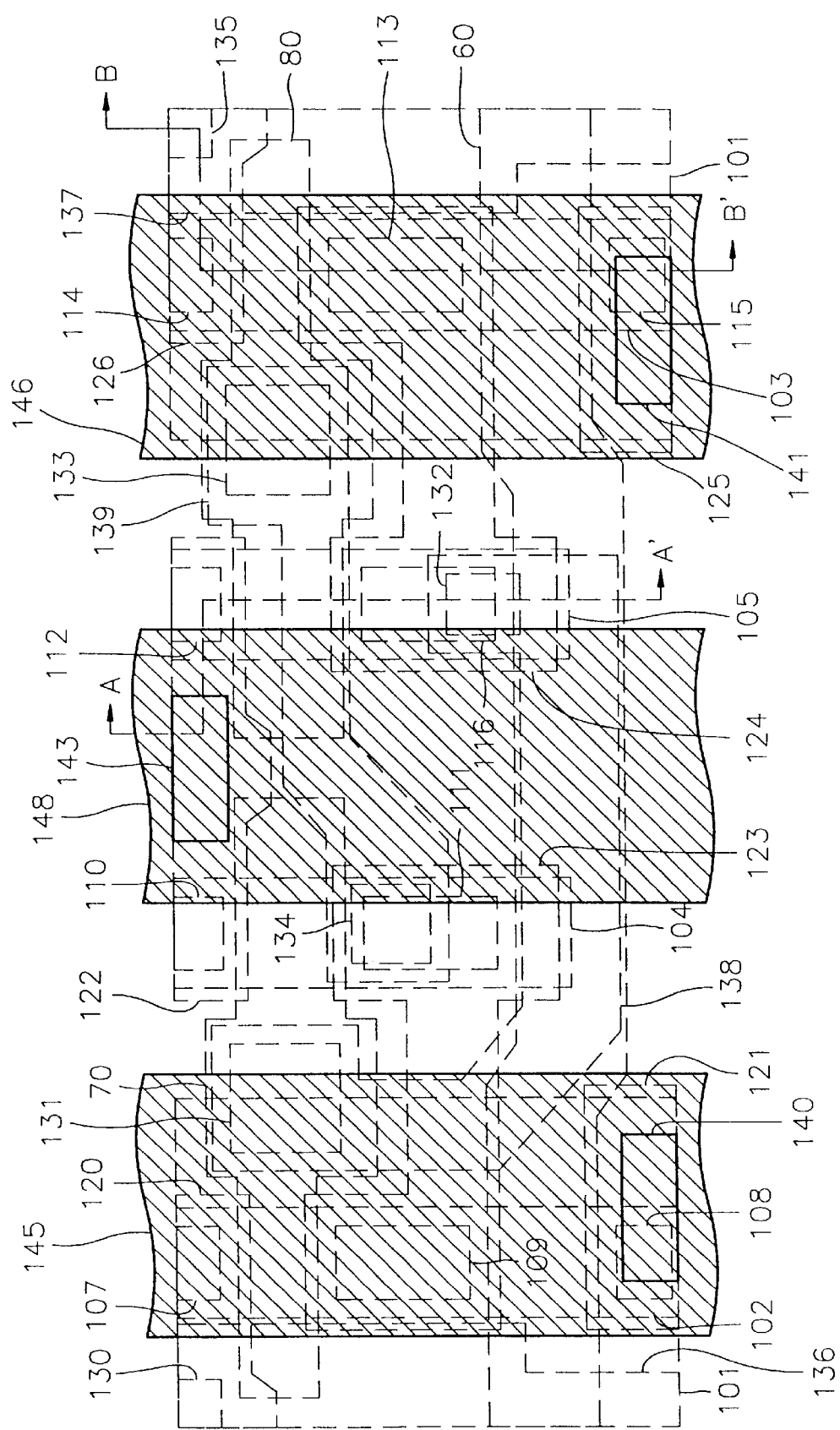

Referring to FIG. 8, the power line pad 122 is electrically connected to a power line 148 intersecting the word line 60. The power line 148 contacts with the power line pad 122 through a power line contact hole 143 exposing the power line pad 122. Also, the first bit line pad 121 is electrically connected to a first bit line 145 intersecting the word line 60, and the second bit line pad 125 is electrically connected to a second bit line 146 intersecting the word line 60. The first bit line 145 contacts with the first bit line pad 121 through a first bit line contact hole 140 exposing the first bit line pad 121, and the second bit line 146 contacts with the second bit line pad 125 through a second bit line contact hole 141 exposing the second bit line pad 125.

As shown in FIG. 8, the full CMOS SRAM cell according to the present invention has bit lines which are shorter than word lines. Also, active regions of the full CMOS SRAM cell are formed to be straight lines. Thus, physical stress or etching damage etc. applied around edges of the active regions while a device isolation process for defining the active regions is performed, can be minimized. Also, in the full CMOS SRAM cell arrangement redundancy of gate patterns consisting of first and second common conductive electrodes and a word line can be increased. Accordingly, since a SRAM cell having excellent symmetry can be implemented, cell stability can be improved.

Next, a method for manufacturing a full CMOS SRAM cell according to the present invention will be described with reference to FIGS. 9A through 13A and FIGS. 9B through 13B. Here, FIGS. 9A, 10A, 11A, 12A and 13A are vertical section views taken along lines A—A' of FIGS. 4 through 8. FIGS. 9B, 10B, 11B, 12B and 13B are vertical section views taken along lines B13 B' of FIGS. 4 through 8. Thus, sectional views shown in FIGS. 9A through 13A and FIGS. 9B through 13B only show a second driver transistor, a second transfer transistor, and a second load transistor. As a result, when describing each drawing, description related to a first driver transistor, a first transfer transistor, and a first load transistor, having shapes symmetrical to the second driver transistor, the second transfer transistor, and the second load transistor, will be omitted.

Referring to FIGS. 9A and 9B, a first conductive type well region 101, preferably, a p-well region is selectively formed in a predetermined area of a semiconductor substrate 201. The semiconductor substrate 201 around the first conductive type well region 101 corresponds to a semiconductor substrate in which a second conductive type impurity, namely, an n-type impurity, is doped, or an n-well region. A device isolation layer 205 is selectively formed in a predetermined area of the semiconductor substrate in which the first conductive type well region 101 is formed, to define first through fourth active regions 102, 103, 104, and 105 of FIG. 4. The device isolation layer 205 is formed by using a well-known local oxidation of silicon (LOCOS) process or a trench device isolation process. At this time, the active regions defined by the device isolation layer 205 are formed to be straight lines as shown in FIG. 4. Thus, like in the prior art, physical stress or etching damage applied concentrically on curved areas of active regions can be minimized. As a result, a phenomenon in which crystalline defects occur along edges of the active regions, can be suppressed at its maximum as much as is practically possible. Here, an active region shown in FIG. 9A corresponds to a fourth active region 105 of FIG. 4, and an active region shown in FIG. 9B corresponds to a second active region 103 of FIG. 4. A gate dielectric layer 207, for example, a thermal oxidation layer, is formed in the active regions. A process of forming the first conductive type well region 101 can also be performed after forming a device isolation layer 205.

Figure 10A:
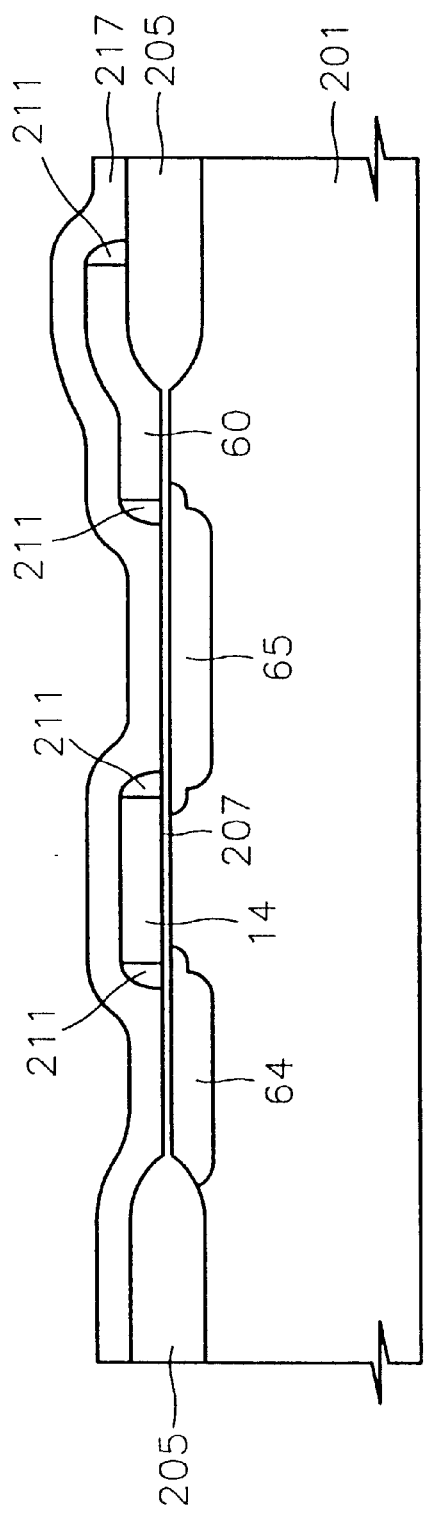
Figure 10B:
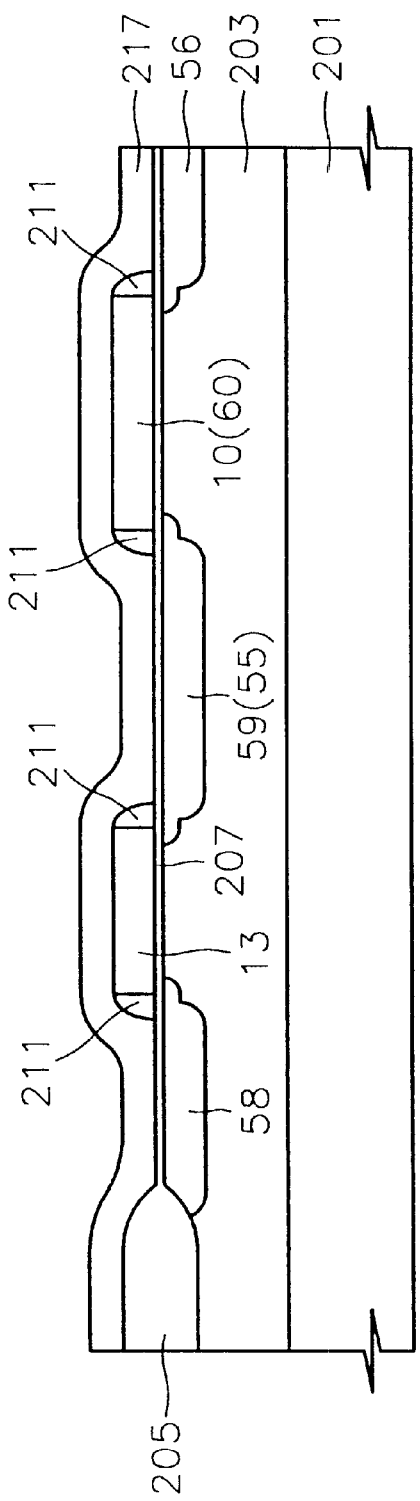

Referring to FIGS. 10A and 10B, a first conductive layer, for example, a doped polysilicon layer is formed on the entire surface of the semiconductor substrate on which the gate dielectric layer 207 is formed. The first conductive layer can be formed of a polycide layer in which the doped polysilicon layer and a silicide layer containing a refractory metal are stacked in order. The word line 60, the first common conductive electrode 70, and the second common conductive electrode 80 shown in FIG. 5 are formed by patterning the first conductive layer. As a result, a gate electrode 14 of the second load transistor (TL2 of FIG. 5) is formed in the fourth active region 105 of FIG.10A, and a gate electrode 13 of the second driver transistor (TD2 of FIG. 5) is formed in the second active region 103 of FIG. 10B. At this time, a word line 60 passing an upper portion of edges of the fourth active region 105 of FIG. 10A and an upper portion of the second active region 103 of FIG. 10B is formed on a semiconductor substrate. The word line 60 in the upper portion of the second active region 103 corresponds to a gate electrode 10 of the second transfer transistor (TA2 of FIG. 5).

A spacer 211 is formed on sidewalls of the word line 60, the first common conductive electrode 70, and the second common conductive electrode 80. As a result, the spacer 211 is formed on sidewalls of the gate electrode 14 of the second load transistor, and the gate electrode 13 of the second driver transistor. Also, first conductive type source/drain areas 64 and 65, that is, p-type source/drain areas, are selectively formed in the fourth active region of both sides of the gate electrode 14 of the second load transistor. Furthermore, source/drain areas 58 and 59 of the second driver transistor and source/drain areas 55 and 56 of the second transfer transistor are selectively formed in the second active region crossing the gate electrode 13 of the second driver transistor and the word line 60 by implanting a second conductive type impurity. Here, the drain area of the second driver transistor corresponds to the source area 55 of the second transfer transistor. A first interdielectric layer 217 is formed on the entire surface of the semiconductor substrate in which the first and second conductive type source/drain areas 64, 65, 55, 56, 58, and 59 are formed.

Referring to FIGS. 11A and 11B, a second power line pad contact hole 112 exposing the source area 64 of the second load transistor TL2, a second node pad contact hole 116 exposing the drain area 65 of the second load transistor TL2, a second ground line pad contact hole 114 exposing the source area 58 of the second driver transistor TD2, a second node pad contact hole 113 exposing the drain area 59 of the second driver transistor TD2, that is, the source area 55 of the second transfer transistor TA2, and a second bit line pad contact hole 115 exposing the drain area 56 of the second transfer transistor TA2 are formed by consecutively patterning the first interdielectric layer 217 and the gate dielectric layer 207.

A second conductive layer is formed on the entire surface of the semiconductor substrate in which the pad contact holes 112, 113, 114, 115, and 116 are formed. A second ground line pad 126 covering the source area 58 of the second driver transistor TD2, a second node pad 124 electrically connecting the drain area 59 of the second driver transistor TD2 and the drain area 65 of the second load transistor TL2, a second power line pad 122 covering the source area 64 of the second load transistor TL2, and a second bit line pad 125 covering the drain area 56 of the second transfer transistor TA2 are formed by patterning the second conductive layer. A second interdielectric layer 221 is formed on the entire surface of the semiconductor substrate on which pads are formed.

Figure 12A:
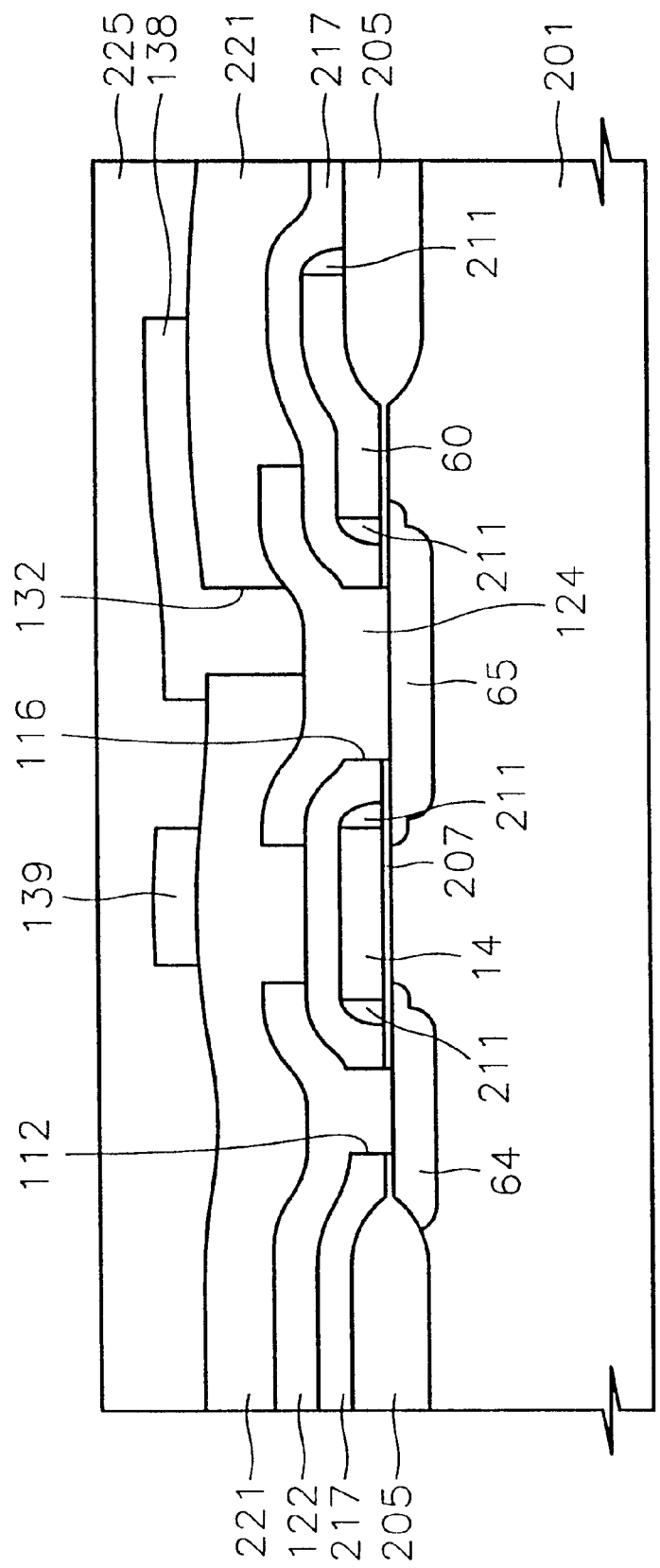
Figure 12B:
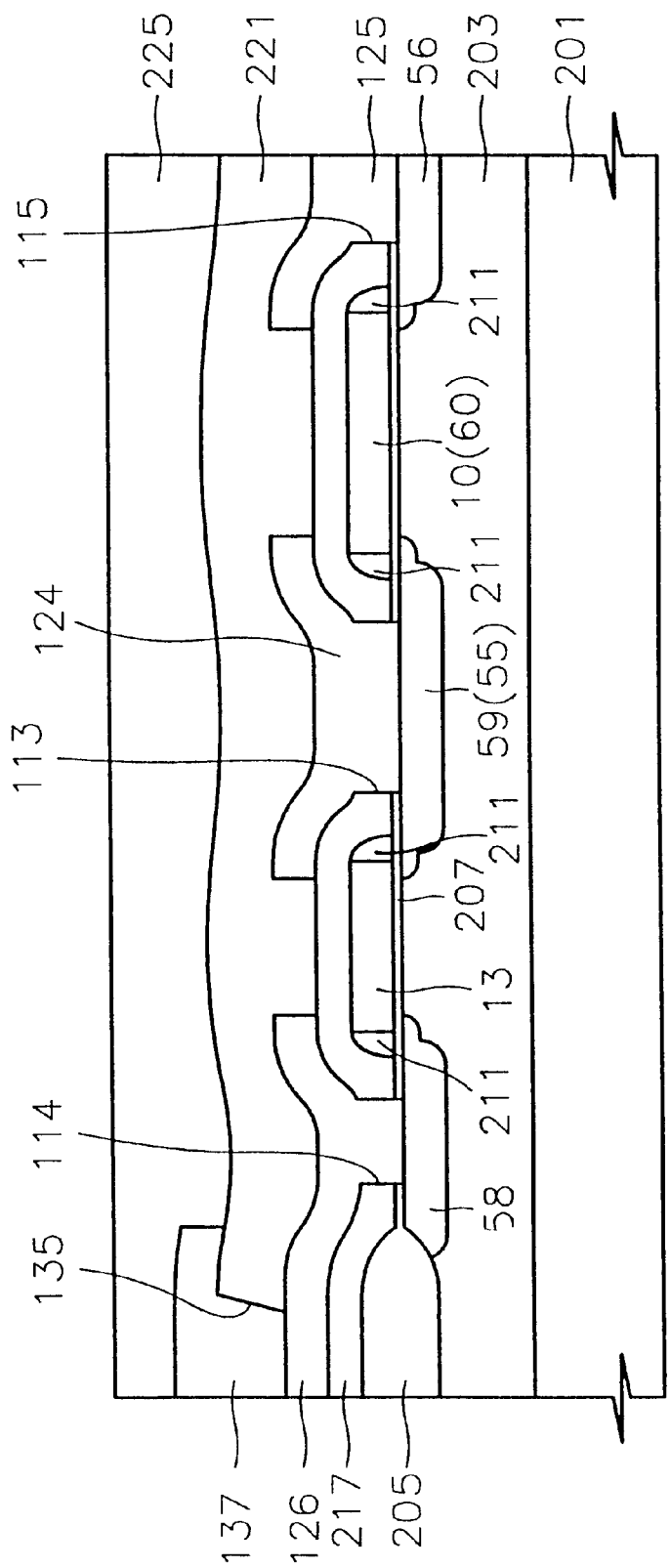

Referring to FIGS. 12A and 12B, a first local interconnection contact hole 132 exposing the second node pad 124, and a second ground line contact hole 135 exposing the second ground line pad 126 are formed by patterning the second interdielectric layer 221. At this time, although not shown, a first local interconnection contact hole 131 exposing a predetermined area of the first common conductive electrode 70 is formed. A third conductive layer is formed on the entire surface of the semiconductor substrate on which the first local interconnection contact holes 131 and 132 and the second ground line contact hole 135 are formed. A first local interconnection 138 connecting the first common conductive electrode 70 and the second node pad 124, a second local interconnection 139 connecting the second common conductive electrode 80 and the first node pad 123, and a second ground line 137 contacting the second ground line pad 126 are formed. A third interdielectric layer 225 is formed on the entire surface of the semiconductor substrate on which the second ground line 137, the first local interconnection 138, and the second local interconnection 139 are formed.

Figure 13A:
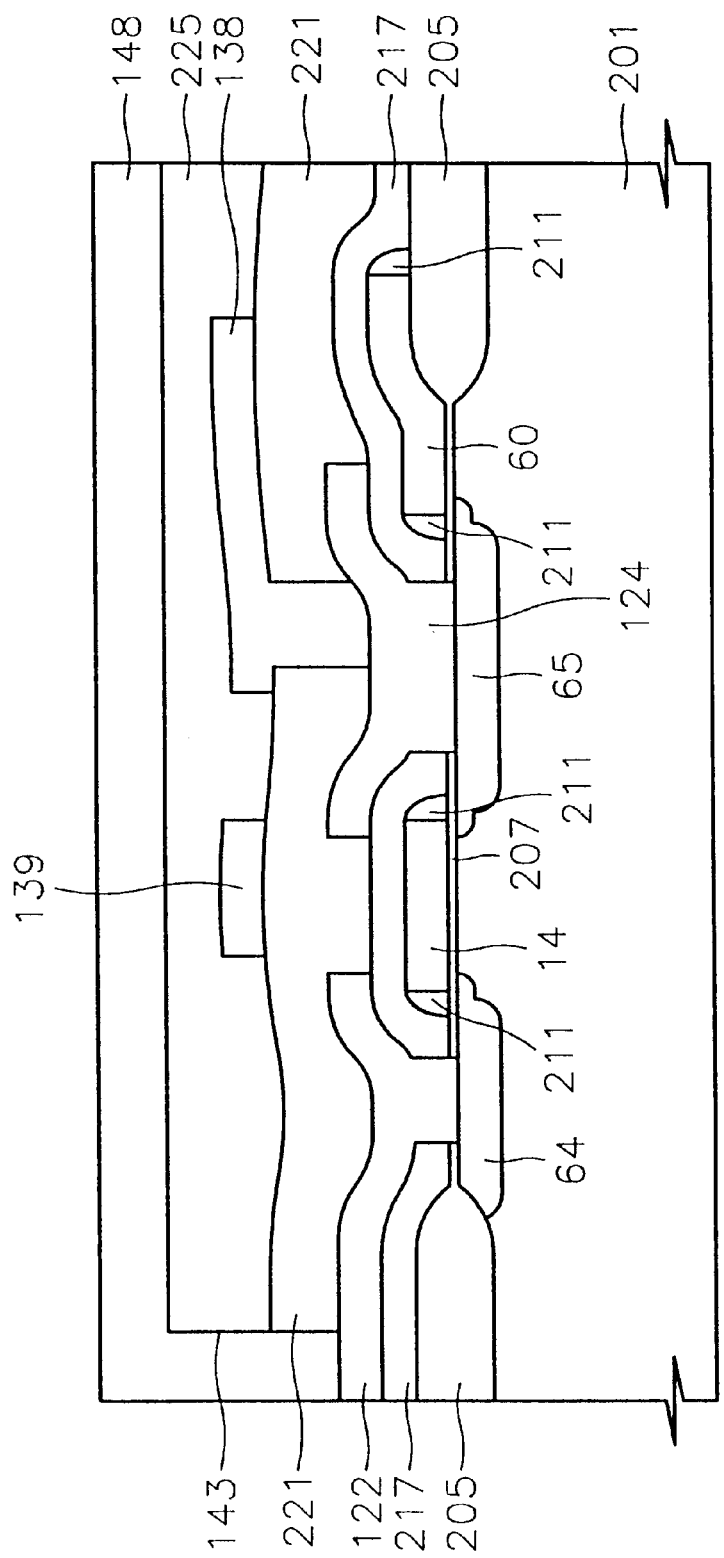
Figure 13B:
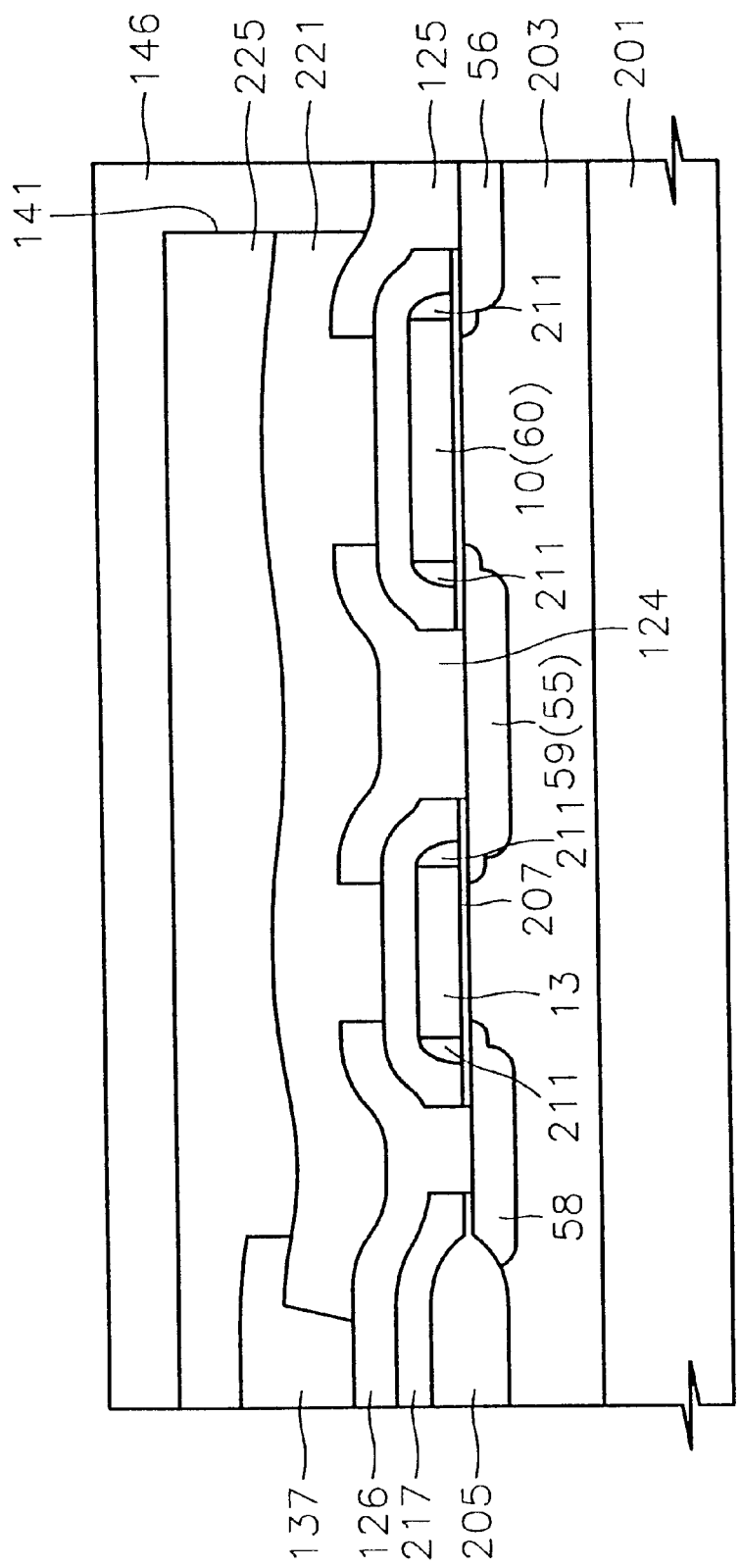

Referring to FIGS. 13A and 13B, a power line contact hole 143 exposing the power line pad 122, and a second bit line contact hole 141 exposing the second bit line pad 125 are formed by consecutively patterning the third interdielectric layer 225 and the second interdielectric layer 221. A fourth conductive layer is formed on the entire surface of the semiconductor substrate on which the contact holes 141 and 143 are formed. A power line 148 intersecting the word line 60, and a second bit line 146 are formed by patterning the fourth conductive layer.

As described above, the first through fourth active regions in which the first and second driver transistors, the first and second load transistors, and the first and second transfer transistors are formed, are formed to be parallel straight lines. Thus, since a physical stress or etching damage applied along edges of each of the active regions while the device isolation process for forming the device isolation layer is performed, can be minimized, crystalline defects etc. formed on the edges of each of the active regions can be remarkably reduced. As a result, since leakage current characteristics of node contacts formed in each of the active regions can be remarkably improved, operation characteristics of the SRAM cell, for example, low voltage characteristics and data retention characteristics can be improved. Further, since each of the active regions is formed to be straight lines, even when gate patterns intersecting the active regions are misaligned along a direction parallel to each of the active regions, channel widths of each of transistors are unchanged. Accordingly, a SRAM cell having excellent symmetry can be realized. As a result, cell stability can be improved. Further, according to the present invention, it is easy to implement SRAM cell having bit lines which are shorter than word lines. Therefore, since resistance and parasitic capacitance of the bit lines can be reduced, an access time of the SRAM device can be reduced.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A full CMOS SRAM cell comprising:
    first and second active regions formed on a semiconductor substrate, the first and second active regions being arranged parallel to each other;
    third and fourth active regions formed on the semiconductor substrate between the first active region and the second active region, the third and fourth active regions being arranged parallel to the first and second active regions, respectively, and being arranged in a region neighboring the first active region and a region neighboring the second active region, respectively;
    a word line intersecting the first and second active regions;
    a first common conductive electrode intersecting the first active region and the third active region, the first common conductive electrode being parallel to the word line; and
    a second common conductive electrode intersecting the second active region 14 and the fourth active region, the second common conductive electrode being parallel to is the word line;
    a first transfer transistor having the word line as a gate electrode, formed in the first active region;
    a first driver transistor having the first common conductive electrode as a gate electrode, formed in the first active region;
    a first load transistor having the first common conductive electrode as a gate electrode, formed in the third active region;
    a second transfer transistor having the word line as a gate electrode, formed in the second active region;
    a second driver transistor having the second common conductive electrode as a gate electrode, formed in the second active region; and
    a second load transistor having the second common conductive electrode as a gate electrode, formed in the fourth active region.

2. The full CMOS SRAM cell according to claim 1, wherein the first and second driver transistors and the first and second transfer transistors are NMOS transistors, and the first and second load transistors are PMOS transistors.

3. The full CMOS SRAM cell according to claim 1, further comprising:
    a first node pad for electrically connecting a drain area of the first driver transistor and a drain area of the first load transistor with each other; and
    a second node pad for electrically connecting a drain area of the second driver transistor and a drain area of the second load transistor with each other.

4. The full CMOS SRAM cell according to claim 3, further comprising:
    a first local interconnection for electrically connecting the first node pad and the second common conductive electrode with each other; and
    a second local interconnection for electrically connecting the second node pad and the first common conductive electrode with each other.

5. The full CMOS SRAM cell according to claim 1, further comprising:
    a first ground line electrically connected to a source area of the first driver transistor, the first ground line intersecting the word line; and
    a second ground line electrically connected to a source area of the second driver transistor, the second ground line intersecting the word line.

6. The full CMOS SRAM cell according to claim 5, further comprising:
    a first ground line pad interposed between the source area of the first driver transistor and the first ground line; and
    a second ground line pad interposed between the source area of the second driver transistor and the second ground line.

7. The full CMOS SRAM cell according to claim 1, further comprising a power line electrically connected to the source area of the first load transistor and the source area of the second load transistor, the power line intersecting the word line.

8. The full CMOS SRAM cell according to claim 7, further comprising a power line pad interposed between the source area of the first and second load transistors and the power line.

9. The full CMOS SRAM cell according to claim 1, further comprising;
    a first bit line electrically connected to the drain area of the first transfer transistor, the first bit line intersecting the word line; and
    a second bit line electrically connected to the drain area of the second transfer transistor, the second bit line intersecting the word line.

10. The full CMOS SRAM cell according to claim 9, further comprising; a first bit line pad interposed between the first bit line and the drain area of the first transfer transistor; and
    a second bit line pad interposed between the second bit line and the drain area of the second transfer transistor.

* * * * *

UNITED STATES PATENT AND TRADEMARK OFFICE
CERTIFICATE OF CORRECTION

PATENT NO. : 6,445,017 B2
DATED : September 3, 2002
INVENTOR(S) : Jun-eui Song

It is certified that error appears in the above-identified patent and that said Letters Patent is hereby corrected as shown below:

Column 11,
Line 39, delete "14".
Line 41, delete "is".

Signed and Sealed this

Nineteenth Day of April, 2005

JON W. DUDAS
*Director of the United States Patent and Trademark Office*